(12) United States Patent
Katic et al.

(10) Patent No.: US 12,155,384 B2
(45) Date of Patent: Nov. 26, 2024

(54) REFERENCE CLOCK FREQUENCY CORRECTION BY MIXING WITH DIGITALLY-CONTROLLED LOW-FREQUENCY COMPENSATION SIGNAL

(71) Applicant: Stathera IP Holdings Inc., Montreal (CA)

(72) Inventors: Nikola Katic, Toronto (CA); Javid Musayev, Toronto (CA)

(73) Assignee: Stathera IP Holding, Inc., Montreal (CA)

( * ) Notice: Subject to any disclaimer, the term of this patent is extended or adjusted under 35 U.S.C. 154(b) by 0 days.

(21) Appl. No.: 18/300,188

(22) Filed: Apr. 13, 2023

(65) Prior Publication Data

US 2023/0336162 A1 Oct. 19, 2023

Related U.S. Application Data

(60) Provisional application No. 63/330,542, filed on Apr. 13, 2022.

(51) Int. Cl.
*H03K 3/011* (2006.01)
*G06F 1/02* (2006.01)
(Continued)

(52) U.S. Cl.
CPC .............. *H03K 3/011* (2013.01); *G06F 1/022* (2013.01); *H03B 1/04* (2013.01); *H03B 5/04* (2013.01);
(Continued)

(58) Field of Classification Search
CPC .. G06F 1/022; H03B 5/30; H03B 5/32; H03B 1/04; H03B 5/04; H03B 21/00;
(Continued)

(56) References Cited

U.S. PATENT DOCUMENTS 7,227,423 B2 6/2007 McCorquodale et al.
8,594,253 B2 11/2013 Breems et al.
(Continued)

FOREIGN PATENT DOCUMENTS

EP 1443640 A1 8/2004
EP 2180593 A1 * 4/2010 ............ H03D 7/161

OTHER PUBLICATIONS

International Searching Authority, PCT International Search Report and Written Opinion, PCT International Application No. PCT/US2023/050506, May 9, 2023, 10 pages.

*Primary Examiner* — Ryan Johnson
(74) *Attorney, Agent, or Firm* — LEE SULLIVAN SHEA & SMITH LLP

(57) ABSTRACT

A system for reference clock frequency correction is described. The system comprises a compensation module configured to (i) receive, as input, an oscillator signal and one or more control signals, (ii) generate a compensation signal based on the oscillator signal and the one or more control signals, wherein the generated compensation signal is a discretized sinusoidal signal having a controllable frequency, and (iii) output the generated compensation signal. The system further comprises a mixer block configured to (i) receive, as input, the generated compensation signal and the oscillator signal, and (ii) generate an output clock signal by mixing the generated compensation signal with the oscillator signal. A soft-switching method to reduce the effect of quantization noise is further described.

18 Claims, 9 Drawing Sheets

(51) Int. Cl.
  *H03B 1/04* (2006.01)
  *H03B 5/04* (2006.01)
  *H03B 5/30* (2006.01)
  *H03B 21/00* (2006.01)
  *H03K 5/00* (2006.01)
  *H03K 5/135* (2006.01)
  *H03L 1/00* (2006.01)

(52) U.S. Cl.
  CPC ............... *H03B 5/30* (2013.01); *H03B 21/00* (2013.01); *H03K 5/00006* (2013.01); *H03K 5/135* (2013.01); *H03L 1/00* (2013.01)

(58) Field of Classification Search
  CPC ...... H03B 21/01; H03B 21/02; H03B 21/025; H03L 1/00
  See application file for complete search history.

(56) References Cited

U.S. PATENT DOCUMENTS

| | | | | |
|---|---|---|---|---|
| 2014/0015616 A1* | 1/2014 | Mohanty | ................. | H03B 5/30 |
| | | | | 331/34 |
| 2022/0006449 A1* | 1/2022 | Sjöland | ................ | H03J 1/0008 |

* cited by examiner

REFERENCE CLOCK FREQUENCY CORRECTION BY MIXING WITH DIGITALLY-CONTROLLED LOW-FREQUENCY COMPENSATION SIGNAL

CROSS REFERENCE TO RELATED APPLICATIONS

This application claims the benefit of priority to U.S. Provisional Application No. 63/330,542, filed on Apr. 13, 2022, entitled "Reference Clock Frequency Correction By Mixing With Digitally-Controlled Low-Frequency Compensation Signal," which is incorporated herein by reference in its entirety.

TECHNICAL FIELD

The disclosure herein is related to clocking in electrical systems.

BACKGROUND

Modern electrical and electronic systems typically contain a time-keeping device that allows them to: (1) synchronize their external operation with other devices and the rest of the world and (2) synchronize their internal operation between different sub-systems or sub-blocks within the same system. For this time-keeping and synchronization purpose, very precise clock signal sources such as quartz crystal oscillators, micro-electromechanical systems (MEMS) oscillators or bulk-acoustic wave (BAW) oscillators are most often used. However, all these clock signal sources have tiny deviations from their exact target frequency of operation which are known as frequency shifts. Frequency shifts can originate from many sources including manufacturing imperfections, temperature drifts, device aging and physical stress. These tiny frequency shifts can cause errors in system synchronization after sufficient time has passed due to phase error accumulation. Therefore, in cases which require the system clock frequency to be very accurate, a form of clock signal frequency compensation is often needed to correct for these effects.

SUMMARY

One common example of clock signal frequency compensation can be found in temperature-compensated crystal oscillator (TCXO) systems. The quartz crystals utilized in these systems typically have low motional impedance, which means loading them with another electrically controllable impedance can significantly alter (pull) their resonance frequency. Typically, within the TCXO system, a temperature sensing element is responsible for monitoring the temperature and the crystal loading is adjusted accordingly to compensate. Overall, this TCXO feedback-loop acts to eliminate the temperature dependent frequency shifts, thereby resulting in a stable TCXO frequency within a certain temperature range.

However, this approach for frequency compensation becomes intractable when the range of frequency shifts becomes too wide for the feedback-loop to handle (e.g., 100 ppm or more). In MEMS oscillators, the range of frequency shifts can be as high as several thousand ppm due to manufacturing tolerances and the significantly larger temperature coefficient of frequency of silicon as compared to quartz. In addition, the above-described electrical feedback-loop is not possible for resonators with high motional impedances, which are used in most MEMS oscillators. This is because for very high motional impedances, the electrical loading has a negligible effect on the resonant frequency. Instead, existing approaches for frequency compensation in oscillators with either high motional impedance resonators or a wide range of frequency shifts (or both), involve using phase-locked-loops (PLLs) to correct frequency shifts before the source clock oscillator signal is distributed to the system. PLLs contain an internal voltage-controlled oscillator (VCO) used to create another clock signal at a different (usually much higher) frequency. The new signal is then "phase-locked" to the source clock oscillator signal to synchronize the signals and reduce the VCO phase noise. By modifying the ratio between the source clock oscillator frequency and the frequency of the PLL VCO, frequency shifts in the source clock oscillator signal can be easily corrected.

PLLs are practical in systems where the required frequency of operation is very high (e.g., in the GHz range). For instance, if low noise operation is needed, PLL VCOs almost inevitably must be designed as an LC-tank (where L is inductance and C is capacitance value), and as practical inductance and capacitance values are very low in integrated technologies, LC-tank VCO resonant frequencies are often in the GHz range by default. However, again due to limitations of very large-scale integration (VLSI) technologies, the quality factor (Q-factor) of such integrated LC-tank oscillators is very low compared to typical source clock oscillators such as quartz crystals and MEMS oscillators. A lower Q-factor of the LC-tank results in higher noise of the newly created signal, such that additional power needs to be invested in the PLL to achieve the required phase noise performance. Consequently, it is power inefficient to use PLLs in systems where a source clock oscillator signal in the kHz or MHz range needs to be corrected, and therefore it would be beneficial to eliminate the need for PLLs in such systems. Eliminating PLLs would allow high Q-factor source clock oscillator signals to be used exclusively without generating a new signal from a lower Q-factor VCO. It would also eliminate the need to generate any power-hungry GHz range signals which would further improve power efficiency. Accordingly, the present disclosure is directed toward alternative systems and methods to help address these or other issues.

A system in one embodiment includes a compensation module for generating and controlling the low-frequency compensation signal and a mixer for mixing the oscillator clock with the compensation signal therefore providing the reference frequency correction.

A system in yet another embodiment receives an oscillator signal coming from a MEMS resonator.

A method in one embodiment uses passive mixers to implement the mixing function.

A method in another embodiment includes a soft-switching technique in the compensation module (after the digital decoder) to produce a more accurate low-frequency sinusoidal shape of the compensation signal and hence reduce the effect of quantization noise on the system performance.

A method in yet another embodiment uses passive mixers arranged in a quadrature mixing topology for mixing the compensation signal with the oscillator signal.

A method in yet another embodiment uses a digitally-controlled variable-gain-amplifier (VGA) as a passive mixer to implement the quadrature mixing.

In yet another embodiment a method uses a switch-capacitor front-end having a variable-impedance to control the gain of the mixer VGA.

In yet another embodiment a method uses a digital counter in the compensation module.

A method in yet another embodiment uses an integer N value fed to a counter to control the compensation signal frequency.

A method in yet another embodiment sets the compensation signal frequency to be equal to $f_{osc}/N$, wherein $f_{osc}$ is the frequency of the oscillator clock signal.

In yet another embodiment a method uses a digital decoder in the compensation module. The digital decoder herein, is any digital module used to generate a sinusoidal low-frequency signal waveform based on the input signals given to it.

In yet another embodiment a method includes a digital-to-analog converter (DAC) at the compensation module output.

A method in yet another embodiment includes active mixers to implement the quadrature mixing function.

In yet another embodiment a method includes digital divider with or instead of the counter and/or a digital look-up-table and/or a memory block with or instead of the digital decoder in the compensation module.

A system in one embodiment provides the clock signal at the output of the mixer as its final corrected reference clock output signal.

A system in another embodiment includes a post-divider at the output for cases where the output reference clock frequency is considerably smaller than the oscillator frequency.

Other aspects and embodiments of the present disclosure will become apparent from the following detailed description, which, when taken in conjunction with the drawings, illustrate by way of example the principles of the disclosure.

DETAILED DESCRIPTION

Figure 1:
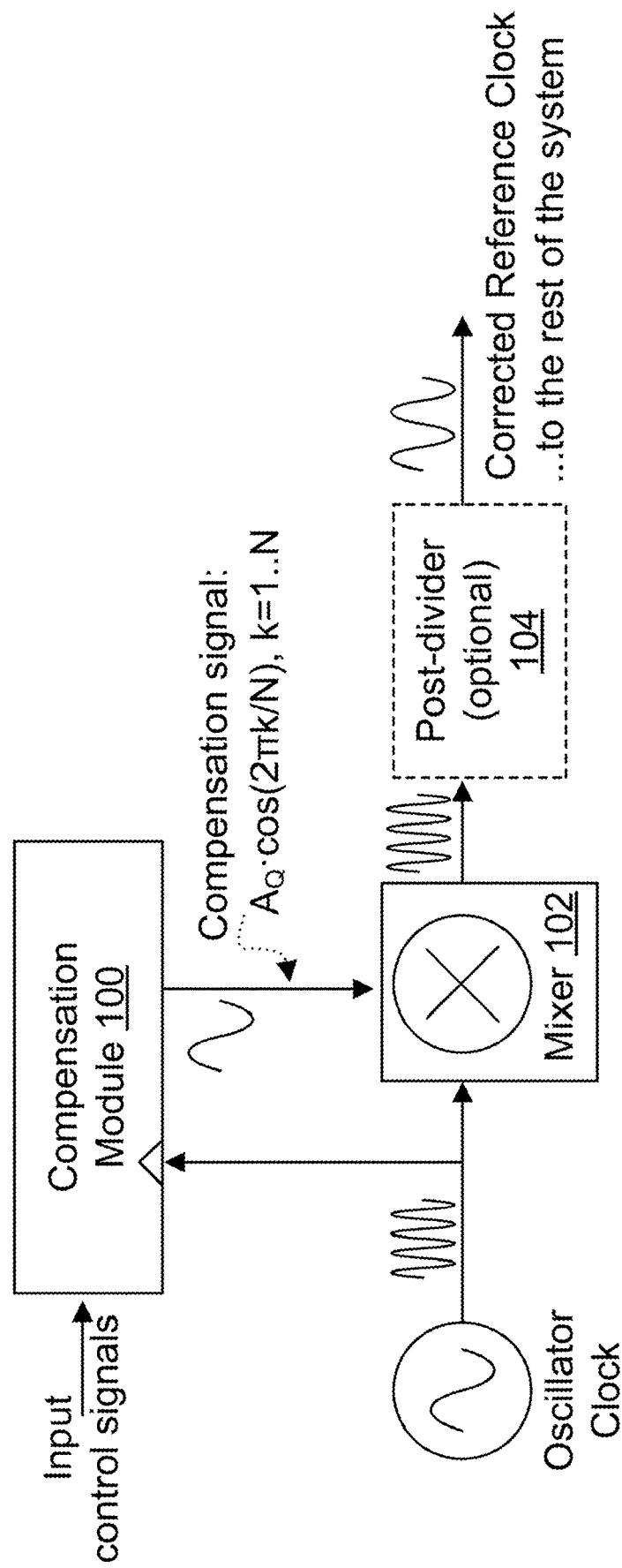
FIG. 1 depicts a schematic diagram of an example reference clock frequency compensation system.

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

This disclosure provides example methods and systems for reference clock signal generation by mixing an oscillator clock signal with a low-frequency compensation signal. In such examples, the frequency of the reference clock signal can be adjusted with respect to the oscillator clock frequency by controlling the frequency and shape of the compensation signal. The compensation signal is generated from the oscillator clock signal itself, which allows the overall system to use a high Q-factor oscillator clock signal throughout and eliminates the need for PLLs that contain low Q-factor VCOs. Consequently, power savings are achieved, because no additional power needs to be consumed to improve the signal-to-noise ratio of the low Q-factor VCO or to handle signals in the GHz frequency range commonly needed in integrated VCOs. As a result, the frequency shifts of the oscillator clock signal caused by manufacturing imperfections, process shifts, and temperature drifts can all be corrected at both lower power and lower noise in accordance with the present disclosure.

In an example system, the system is designed with a specific oscillator in mind such that the target reference frequency and the oscillator frequency match. Hence the only difference between these two frequencies is due to manufacturing imperfections and temperature instability of the oscillator. Therefore, the frequency error that needs to be compensated, is very small compared to either the frequency of the input signal (i.e., the oscillator clock signal) or the frequency of the output signal (i.e., the target reference clock signal). In this case, frequency compensation can be achieved by generating a low-frequency error signal (usually described as a ppm ratio with respect to the target reference signal frequency), and then mixing the low-frequency error signal with the oscillator clock signal to perform the compensation. As used herein, this low-frequency error signal is also referred to as a "compensation signal." This compensation signal is generated by a compensation module.

In conventional radio-frequency (RF) design, the mixing signal, which in RF is called a carrier, has a very high frequency (e.g., GHz range) and is also typically the signal with the highest frequency in the system. In such cases, where the mixing signal has a much higher frequency than the operating frequencies of every other device in the system, any manipulations performed on this signal are extremely expensive in terms of the overall system power. In the new method described herein, however, the situation is the opposite. The compensation signal, which herein is playing a similar role to the RF carrier by acting as a mixing signal, is at an extremely low frequency compared to the operating frequencies of other devices in the system. Hence, any manipulations performed on this mixing signal would come at a very small cost in terms of the overall system power. The methodology for generating the compensation signal can therefore be very different compared to conventional RF circuits.

In another aspect, the present disclosure relates to mixer design. Mixer nonlinearity is one of the major bottlenecks in mixer design. In active mixers, the available voltage headroom and nonlinear characteristics of transistors limit the achievable linearity of the mixer. In switch-based passive mixers, nonlinearity is introduced by the nonlinear nature of switching rather than the nonlinearity of transistors themselves, because switching essentially multiplies a signal with a square-wave containing odd harmonics. In many recent RF applications, passive mixers are chosen for simplicity and device linearity, while the harmonics issue is addressed by implementing multi-phase mixing. Multiple phases of the mixing signal are required in such implementations, which becomes power-inefficient very quickly when the mixing signal itself is at a high (e.g., GHz range) frequency.

In the present disclosure, due to the low frequency of the compensation signal relative to the power consumption of the rest of the system, it is not power expensive to generate a large number of phases and perform multi-phase mixing. Moreover, the compensation signal may be generated by dividing the oscillator clock signal frequency by N (or counting to N), such that N number of phases are intrinsically available. For example, if the oscillator clock signal frequency is to be corrected by 100 ppm (i.e., a ratio of $10^2/10^6$), then the ratio between the oscillator clock signal frequency and the compensation signal frequency is the inverse of this ratio, which is equal to $N=10^6/10^2=10^4$. Therefore, in this example, 10,000 phases of the mixing (compensation) signal are readily available, and with smaller ppm numbers (higher precision), N can get even larger at a negligible power cost. For the sake of comparison, conventional RF mixers commonly use only 4, 8, and in some cases 16 phases. For instance, 8 phase mixers are commonly used as they allow for cancelling the $3^{rd}$ and $5^{th}$ harmonics of the square wave. However, even such low numbers of phases can represent a significant power optimization and performance challenge in RF applications when the mixing signal is operating at a high (e.g., GHz range) frequency.

For multi-phase mixing, generating the required output of the mixer is equivalent to multiplying the input signal by an effective sinusoidal function that is discrete (quantized) in amplitude, and is also discrete in time with steps of $T_s=T_{comp}/N$, where N is the ratio between the oscillator clock signal frequency and the compensation signal frequency, and $T_{comp}$ is the period of the compensation signal. Hence, there are two discretization errors, one in amplitude and one in time (or phase). As N is also equal to the available number of phases (i.e., available resolution in time), with a sufficiently large N and a sufficiently large number of amplitude quantization levels, the nonlinearities can be pushed below the phase noise floor.

In another aspect, the present disclosure relates to the generation and digital control of an extremely low-frequency sinusoidal compensation signal. In one embodiment, the system includes a compensation module for generating and controlling the low-frequency compensation signal and a quadrature mixer for mixing the oscillator clock signal with the compensation signal, resulting in a corrected frequency of the reference clock signal at the output.

FIG. 1 illustrates a schematic diagram of a reference clock frequency compensation system, according to an example embodiment of the present disclosure. As shown, the system includes a compensation module 100 and a mixer block 102. An oscillator clock signal is provided to both the compensation module 100 and the mixer block 102. Based on one or more input control signals, the compensation module 100 generates a digital or analog low-frequency compensation signal. The frequency of this compensation signal must be programmable such that it reflects the value of the actual frequency offset or frequency shift that needs to be corrected as accurately as possible. Whether the compensation signal is digital or analog in amplitude depends on the type of mixer being used—namely, a digital output amplitude is used with a passive mixer, and an analog output amplitude is used with an active mixer. In either case, since the compensation signal is generated digitally, the amplitude levels are discrete, meaning that the compensation signal amplitude ($A_Q$) has a finite number of quantized levels. This compensation signal generated by the compensation module 100 is output and fed to the mixer block 102 to perform frequency correction of the reference clock signal.

As further shown in FIG. 1, in some example embodiments, the system may further include a post-divider 104 configured to frequency divide the output signal of the mixer block 102. This may be useful in examples where the oscillator clock signal frequency to be compensated is much higher than the intended output (reference clock signal) frequency.

Figure 2:
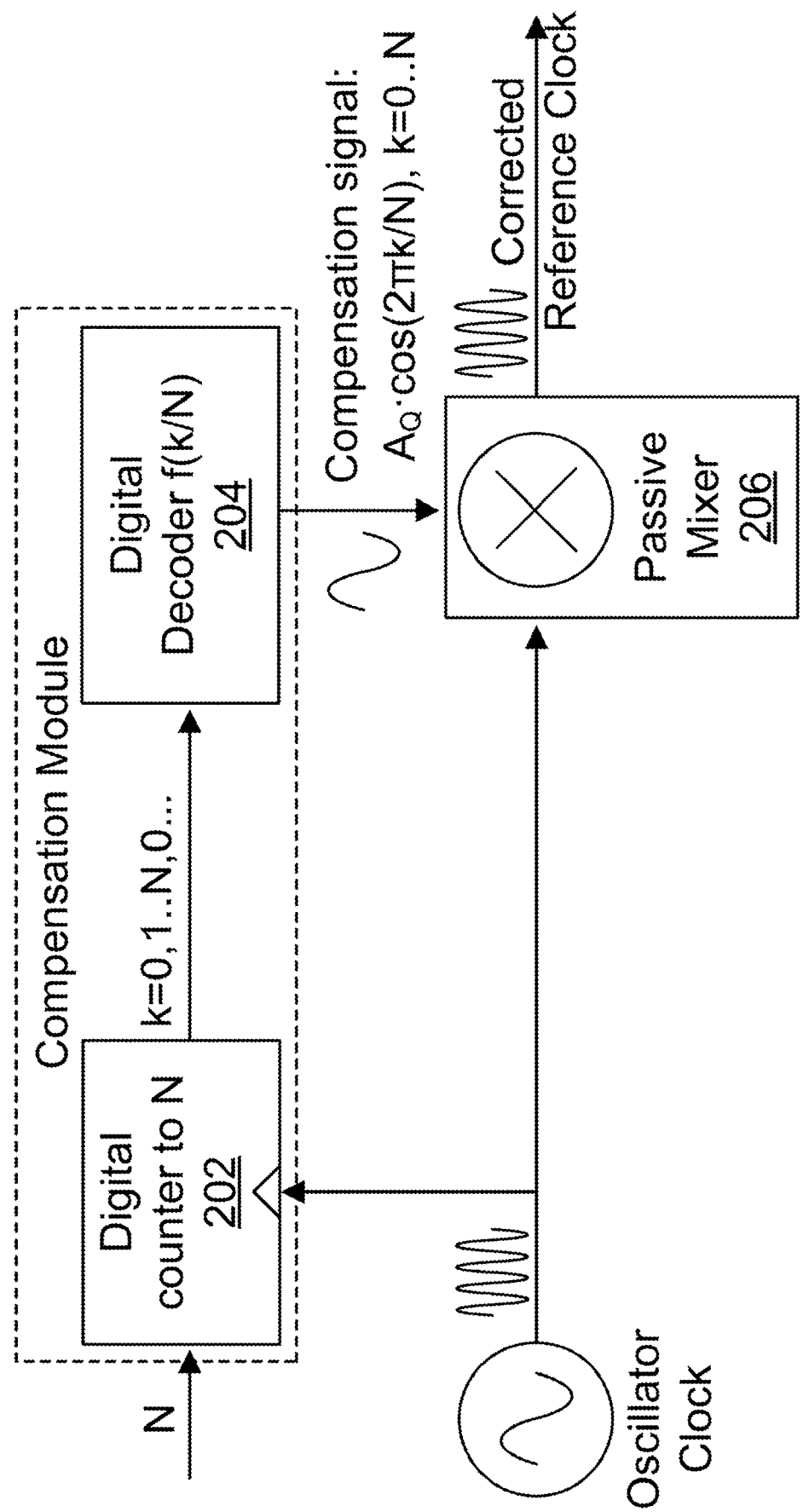
FIG. 2 depicts an example reference clock frequency compensation system in which a compensation signal with digital amplitude is provided to a passive mixer.

FIG. 2 illustrates an example embodiment of the reference clock frequency compensation system depicted in FIG. 1. The embodiment depicted in FIG. 2 uses a digital counter 202 and a digital decoder 204 in the compensation module 100 to generate a digital, discrete-time compensation signal. The compensation signal, $A_Q \cdot \cos(2\pi k/N)$, is a digital number, and this digital number is used to control a switch-based passive mixer 206 directly. In this embodiment, the frequency of the sinusoidal compensation signal is controlled by the digital number N, which serves as an input control signal to the digital counter 202. The digital decoder 204 generates a sine or cosine waveform as a function of k/N, where k is an output of the digital counter 202. The digital decoder 204 can either calculate the sinusoidal function directly, or use a memory block or a look-up table to perform this function. As used throughout this disclosure, the term "sinusoidal" refers to any signal shaped like a sine wave or a phase shift thereof. For instance, a sinusoidal signal may take the form of a sine wave, a cosine wave, or a phase-shifted sine wave or cosine wave. Such sinusoidal signals may be analog signals, or they may be discretized versions of the analog signals, as described in further detail below in connection with FIG. 4.

Figure 3:
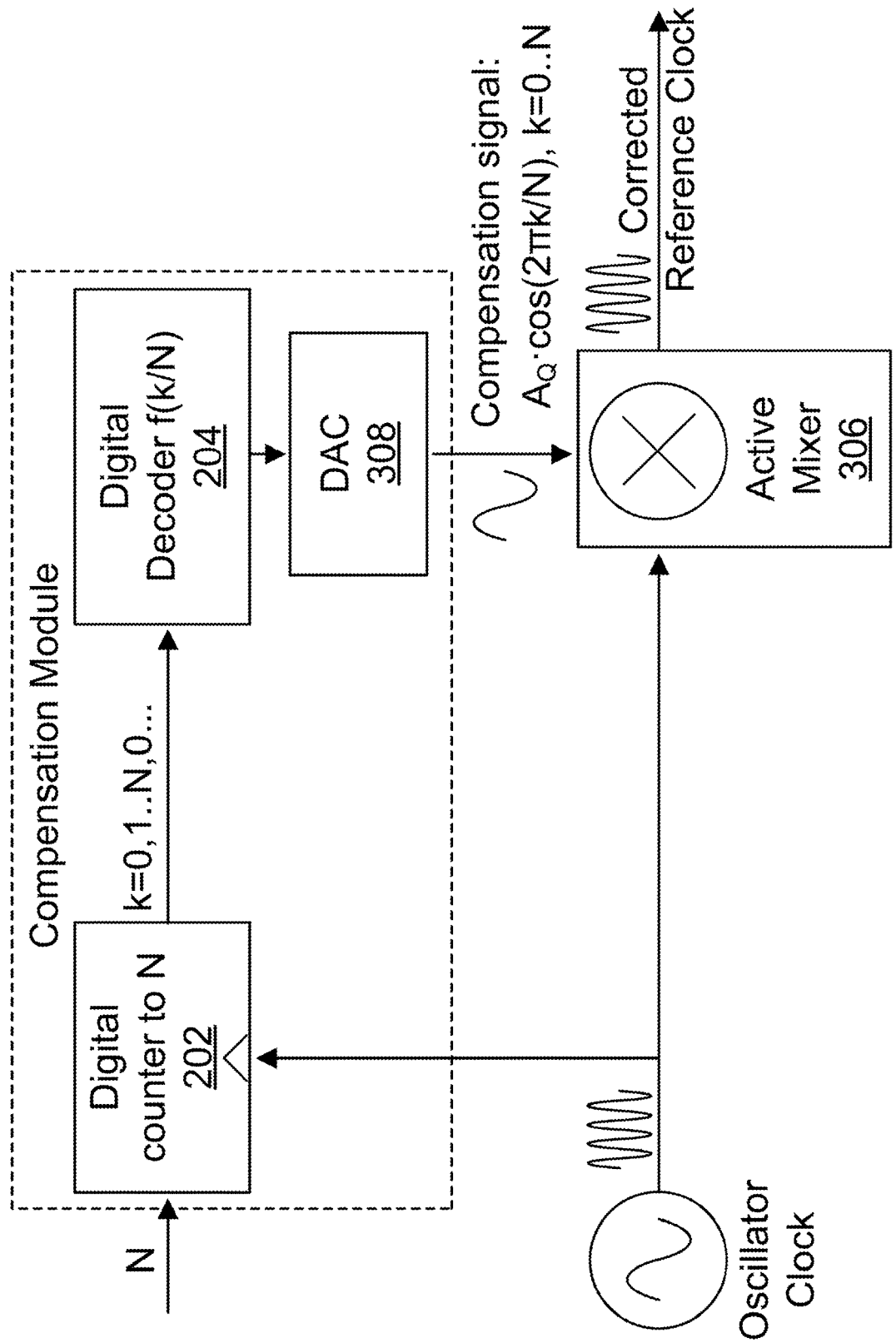
FIG. 3 depicts an example reference clock frequency compensation system in which a compensation signal with analog amplitude is provided to an active mixer.

FIG. 3 illustrates another example embodiment of the reference clock frequency compensation system depicted in FIG. 1. In a manner similar to FIG. 2, the embodiment depicted in FIG. 3 uses a digital counter 202 and a digital decoder 204 in the compensation module 100 to generate a digital, discrete-time compensation signal. In this embodiment, however, the compensation signal is then fed through a digital-to-analog converter (DAC) 308, thereby converting the digital compensation signal into an analog compensation signal suitable for use with an active mixer 306. As a result, the amplitude of the compensation signal, $A_Q$, is an analog value, and this value is used to control the active mixer 306. In this embodiment, the frequency of the sinusoidal compensation signal is again controlled by the digital number N, which serves as an input control signal to the digital counter 202. The digital decoder 204 generates a sinusoidal waveform as a function of k/N, where k is an output of the digital counter 202. The digital decoder 204 can either calculate the sinusoidal function directly, or use a memory block or a look-up table to perform this function.

Figure 4:
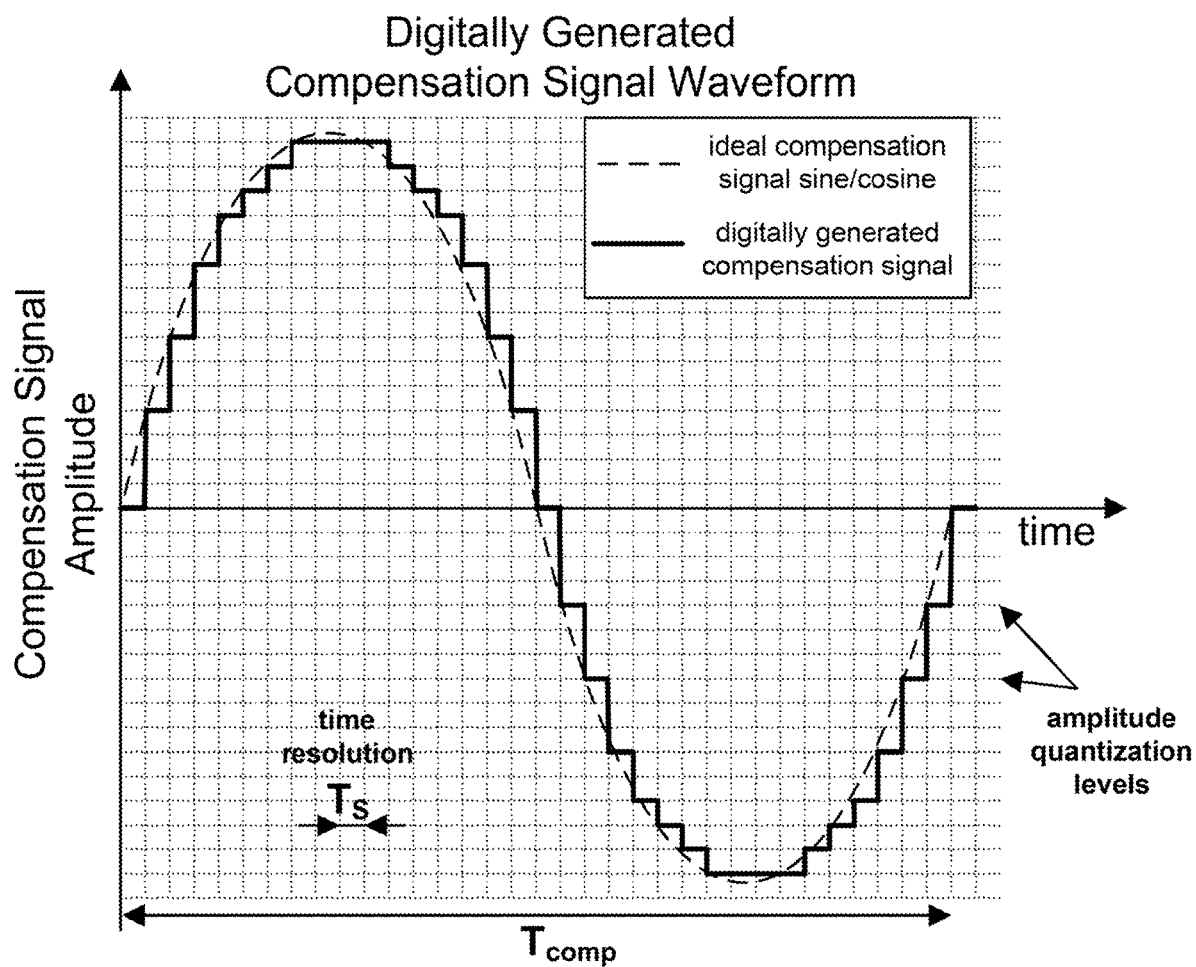
FIG. 4 depicts a quantized discrete-time compensation signal.

FIG. 4 illustrates the digitally generated compensation signal waveform as it is output from the digital decoder 204. The compensation signal is digitally synthesized to emulate an ideal sine or cosine wave with a quantized discrete-time sinusoidal signal. Since the oscillator clock signal is used as the "sampling clock" for the digital decoder 204, the time step Ts is equal to $1/f_{osc}$, where $f_{osc}$ is the oscillator clock frequency. When the compensation signal frequency is small compared to the oscillator clock signal frequency (e.g., up to thousands of ppm), the compensation signal frequency can be generated with high enough accuracy by dividing the oscillator clock signal frequency by an integer number N, hence $T_{comp}=1/f_{comp}=N/f_{osc}=N*Ts$, where $f_{comp}$ is the frequency of the compensation signal. As oscillator clock signal frequency shifts are typically very small compared to the oscillator clock signal frequency, the condition for N to be a large number is satisfied by default. Hence, either a counter or a divider can be used for this purpose. In a counter-based implementation, one way to generate the amplitude of the sinusoidal signal is to keep track of the counter value k, and at each cycle of the oscillator clock signal Ts, utilize the digital decoder 204 to generate an amplitude of the sinusoidal signal based on the ratio k/N. As the k/N ratio ($k/N=k*Ts/T_{comp}$, $k=[0,N]$) can unambiguously be mapped to a phase of the sinusoidal signal, the required amplitude can be directly calculated by the digital decoder 204 or pulled from a lookup table for each k from 0 to N. The number of amplitude quantization levels can be chosen based on the required phase noise performance of the final reference clock signal.

Figure 5:
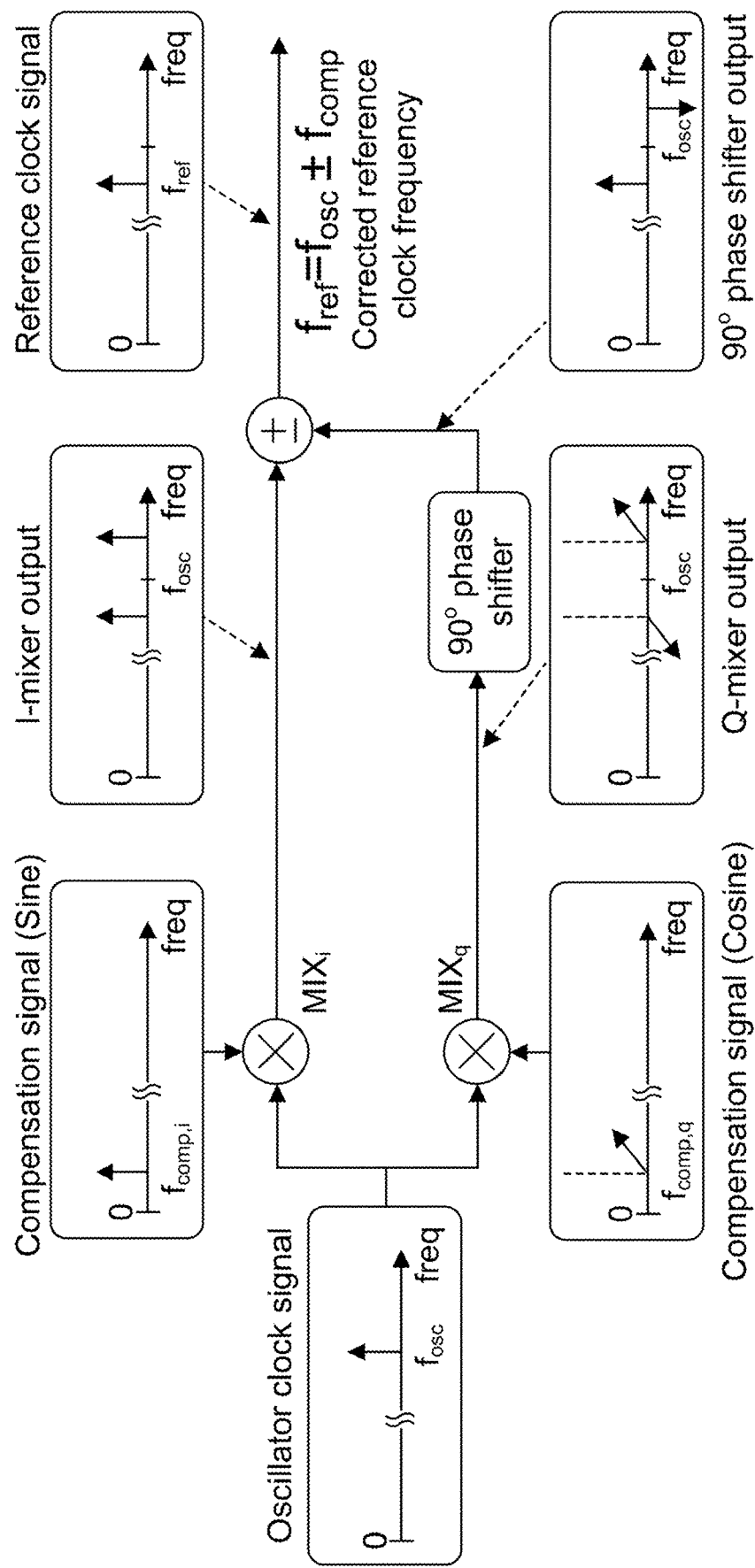
FIG. 5 depicts a schematic of an example low-frequency quadrature mixer.

FIG. 5 illustrates another example embodiment of the mixer 102 in the reference clock frequency compensation system depicted in FIG. 1. In this embodiment depicted in FIG. 5, the mixer 102 uses a quadrature mixer to implement the oscillator clock signal mixing with the low-frequency compensation signal. Mixing the high-frequency oscillator clock signal with the low-frequency compensation signal creates two sideband images surrounding the frequency of the oscillator clock signal $f_{osc}$ and offset from $f_{osc}$ by the frequency of the compensation signal $f_{comp}$. To remove one of the images, quadrature mixing is performed with two mixers; in one mixer the oscillator clock signal at frequency $f_{osc}$ is mixed with a compensation signal tone at $f_{comp}$ (in-phase component) and in the second mixer the oscillator clock signal is mixed with a 90-degree shifted compensation signal tone at $f_{comp}$ (quadrature component). Proper recombination of these two mixer outputs, where the quadrature output is shifted by 90 degrees and either summed with or subtracted from the in-phase output, removes one of the images. Consequently, only the desired tone remains in the final reference clock signal (output). The frequency of the reference clock signal $f_{ref}$ is therefore equal to $f_{osc}$ corrected by the compensation signal frequency $f_{comp}$. Since, $f_{ref}=f_{osc}\pm f_{comp}$, by controlling the value of $f_{comp}$, the exact amount of correction can be added to cancel out any deviations in $f_{osc}$.

Figure 6:
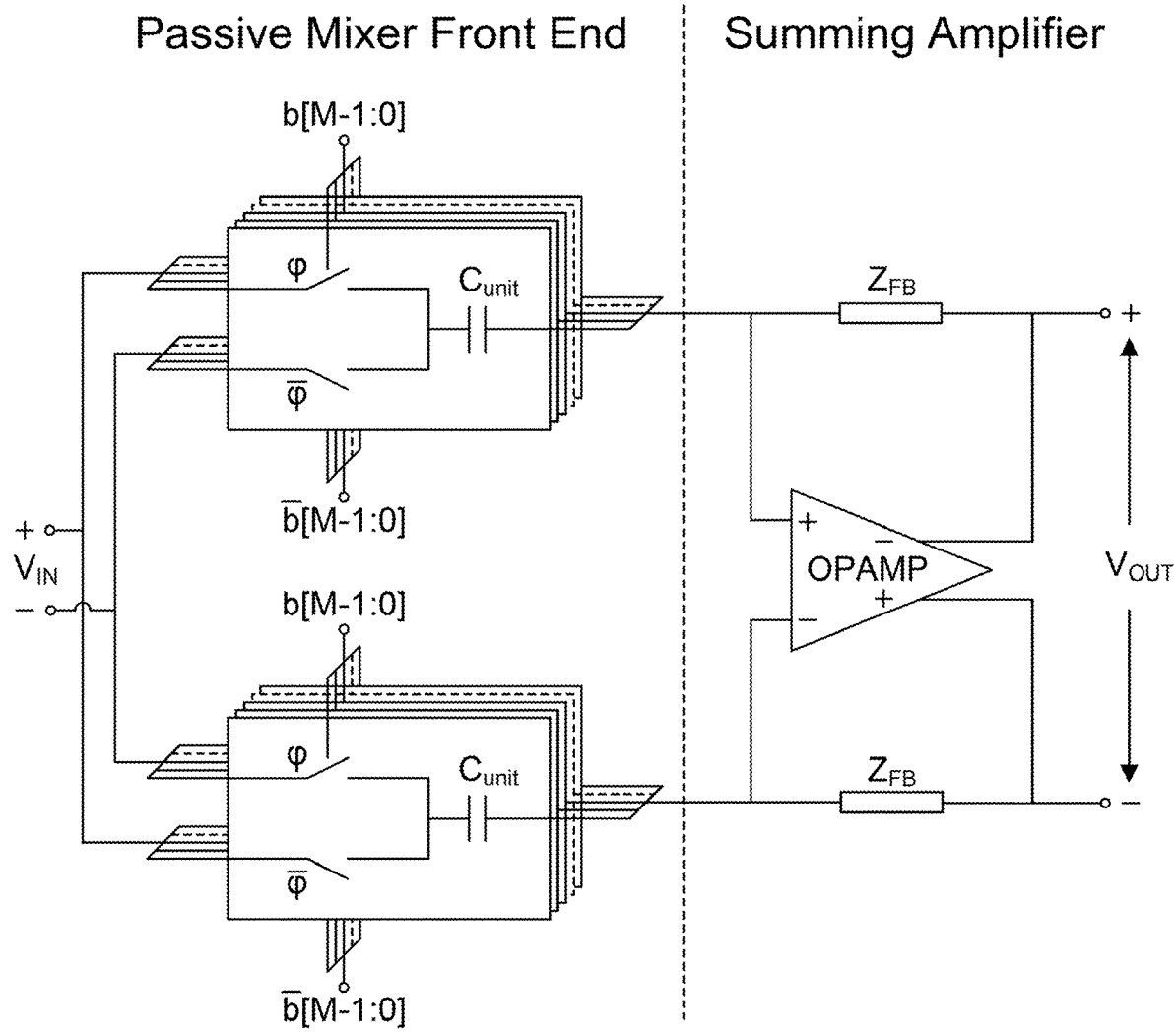
FIG. 6 depicts an example VGA-based passive mixer implementation.

FIG. 6 illustrates another example embodiment of the mixer 102 of the reference clock frequency compensation system depicted in FIG. 1. In this embodiment depicted in FIG. 6, the mixer 102 is implemented as a passive mixer. In some examples, a digitally controlled variable gain amplifier (VGA) with M-bit digital input b, may serve as the passive mixer. The passive mixer depicted in FIG. 6 includes a front-end bank and a summing amplifier. Each unit in the front-end bank is composed of a differential switch pair and a unit capacitor $C_{unit}$. In this embodiment, capacitors may provide improved performance over resistors due to their better scaling, matching, and low noise properties. VGA gain is defined as the ratio of the feedback impedance to the impedance of the front-end. The feedback impedance is fixed at $Z_{FB}$, while the front-end differential admittance can be digitally controlled to (M+1)-levels between $-M\omega C_{unit}/2$ and $+M\omega C_{unit}/2$, where $\omega$ is the angular frequency of the input signal. Therefore, it is possible to change the gain of the proposed amplifier by scaling its input impedance based on input digital code. For every digital bit b[M−1:0], there is a switch y in each unit of the front-end bank connecting to either positive or negative input ($V_{IN}+$ or $V_{IN}-$) and its complementary switch $\overline{\varphi}$ connected to the opposite input. Such differential structure allows having both negative and positive gains by a simple bit-twist. In this particular example, thermometric coding is used, such that M-bits result in (M+1) quantization levels. However, any other encoding (such as binary, gray, etc.) can be adopted without the loss of generality or functionality.

Figure 7:
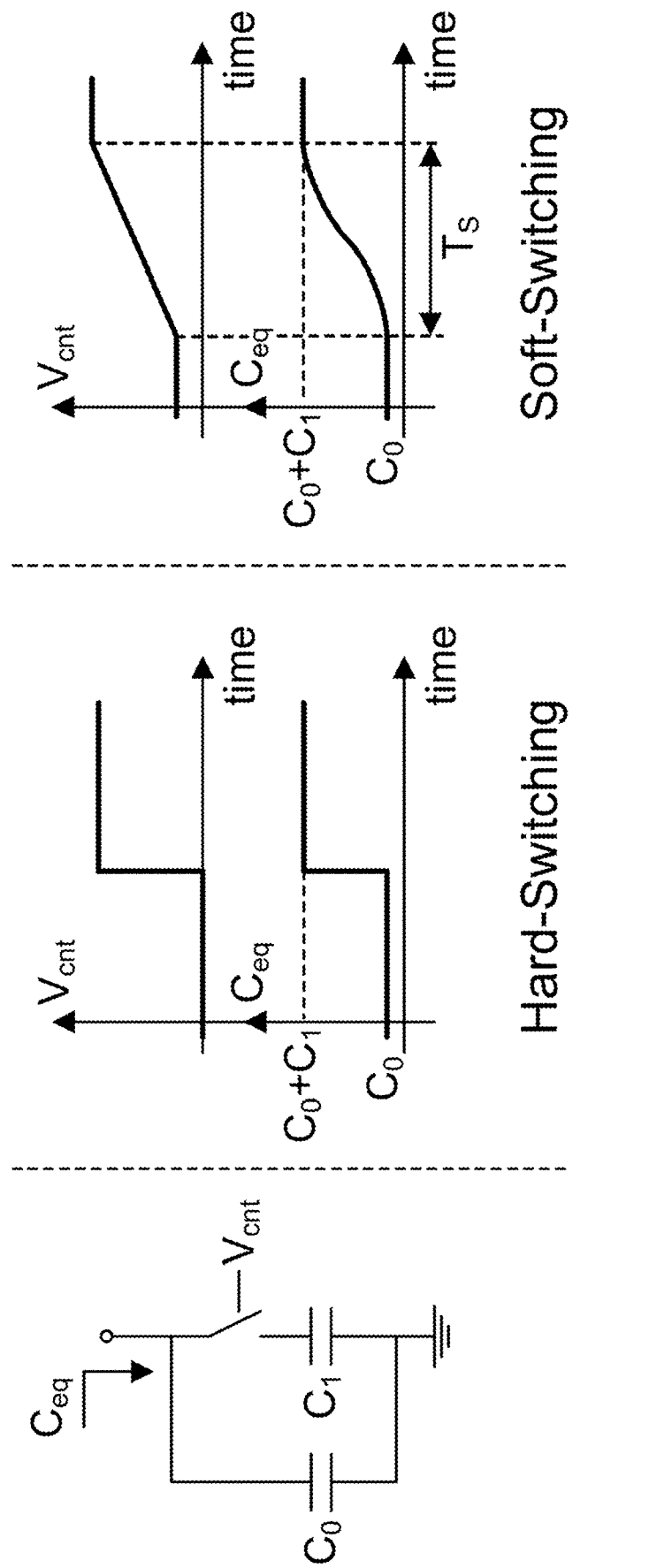
FIG. 7 depicts a schematic illustration of an example soft-switching concept.

FIG. 7 illustrates an example embodiment of a soft-switching technique that the compensation module 100 may use to reduce the amplitude quantization error in the generation of the sinusoidal compensation signal used for mixing. When the control voltage ($V_{cnt}$) changes in a step-like manner, the compensation signal will similarly change in a step-like manner, which is referred to herein as "hard-switching." The soft-switching technique can be achieved by slowing down the edge rate in the $V_{cnt}$, to make the transition from lowest impedance to highest impedance occur gradually within one period of the oscillator clock signal. As a result, the compensation signal will much better approximate the ideal sinusoidal signal, a technique referred to herein as "soft-switching."

Figure 8:
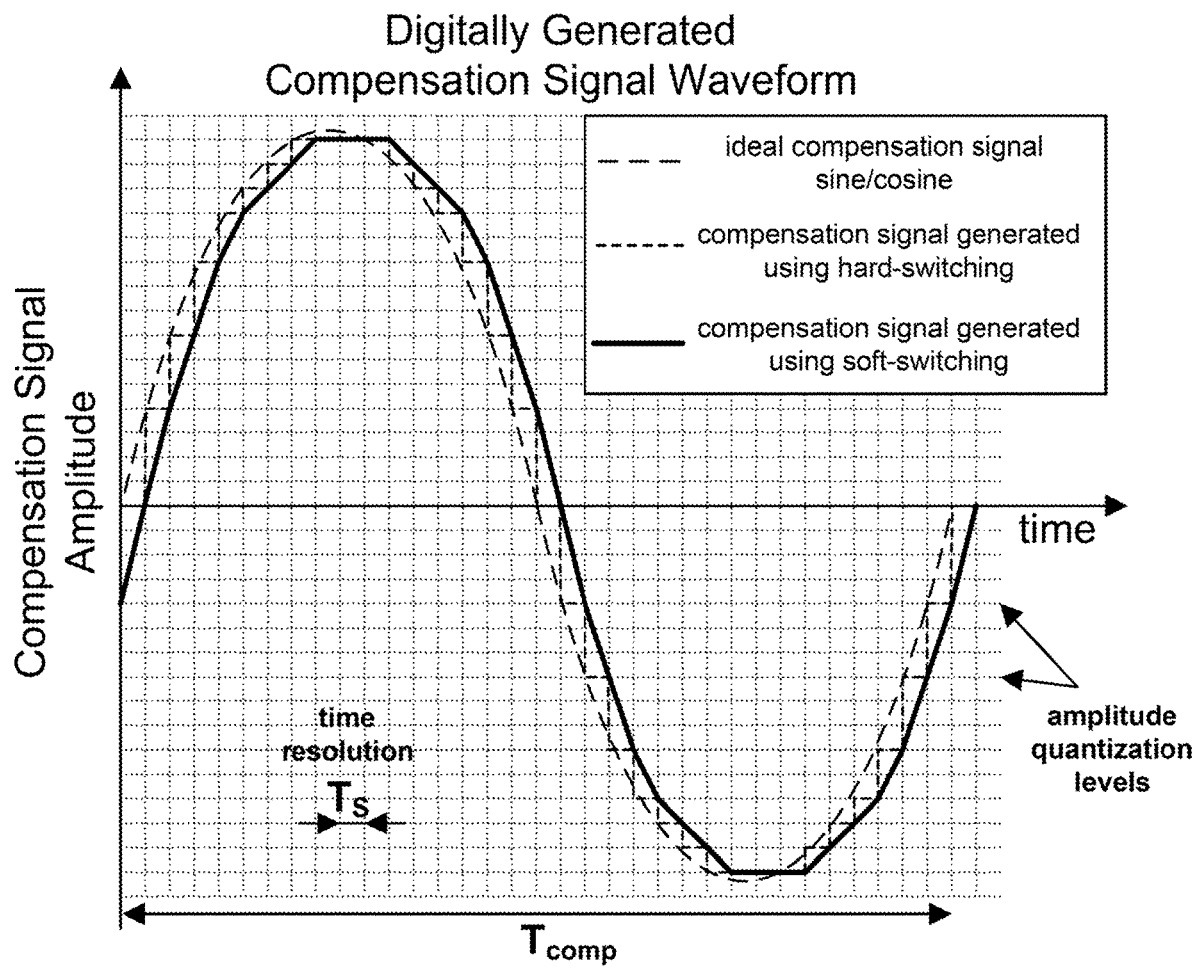
FIG. 8 depicts a waveform illustration of the soft-switching concept.

FIG. 8 illustrates a resulting soft-switching waveform. If switching is done gradually rather than abruptly, it results in a piece-wise linear approximation of the ideal sinusoidal signal, as opposed to a staircase approximation in the case of hard-switching.

Figure 9:
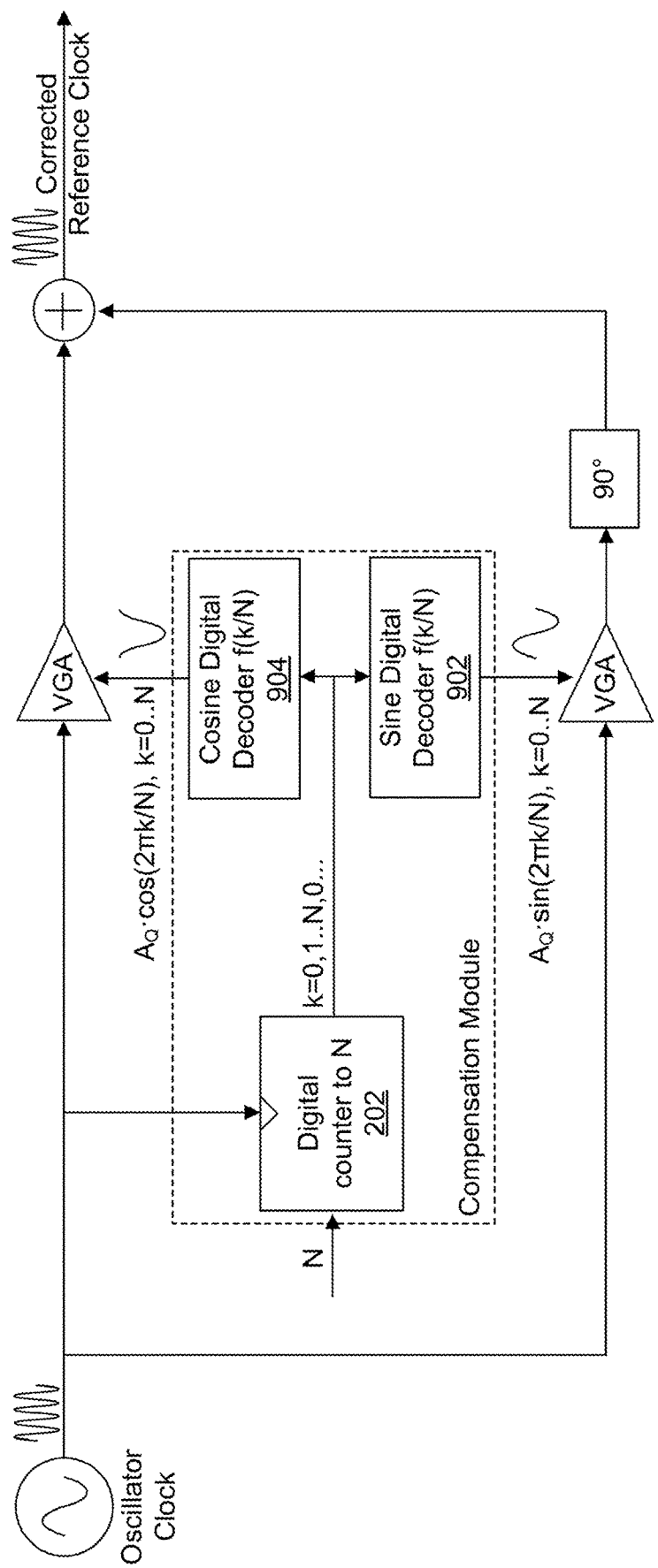
FIG. 9 depicts a system where a set of VGAs are used as quadrature passive mixers.

FIG. 9 illustrates another example embodiment of the reference clock frequency compensation system depicted in FIG. 1. In this embodiment depicted in FIG. 9, two digitally-controlled VGAs are used as intrinsic (I) and quadrature (Q) mixers. A sine digital decoder 902 and a cosine digital decoder 904 are used to effectively shape the gain of VGAs in one full digital counter 202 cycle (k=0 to N) to generate sine and cosine functions respectively. The outputs of the I and Q mixers are shifted by 90 degrees with respect to each other and summed. Both the phase shifting and summing circuits are fairly common and depend on the particular topology, therefore implementation details are not discussed.

Example embodiments of the disclosed innovations have been described above. Those skilled in the art will understand, however, that changes and modifications may be made to the embodiments described without departing from the true scope and spirit of the present invention, which will be defined by the claims. For instance, while certain variations have been discussed in connection with one or more example of this disclosure, these variations can also be applied to various other examples of this disclosure as well.

What is claimed is:

1. A system, comprising:
  a compensation module configured to (i) receive, as input, an oscillator signal and one or more control signals, (ii) based on the oscillator signal and the one or more control signals, generate a discretized sinusoidal signal having a controllable frequency, (iii) determine a compensation signal based on the discretized sinusoidal signal, and (iv) output the compensation signal; and
  a mixer block configured to (i) receive, as input, the compensation signal and the oscillator signal, and (ii) generate an output clock signal by mixing the compensation signal with the oscillator signal.

2. The system of claim 1, wherein the compensation module is configured to receive the oscillator signal from a MEMS resonator.

3. The system of claim 1, wherein the mixer block comprises a passive mixer.

4. The system of claim 3, wherein determining the compensation signal based on the discretized sinusoidal signal comprises using a soft-switching technique to reduce an amplitude quantization noise of the discretized sinusoidal signal.

5. The system of claim 3, wherein the passive mixer is arranged in a quadrature mixing topology for mixing the compensation signal with the oscillator signal.

6. The system of claim 5, wherein the passive mixer comprises one or more digitally controlled variable-gain-amplifiers (VGAs) for mixing the compensation signal with the oscillator signal.

7. The system of claim 6, wherein the one or more VGAs comprise a switched-capacitor front-end having a variable impedance, and wherein a gain of the one or more VGAs is controlled by the variable impedance of the switched-capacitor front-end.

8. The system of claim 1, wherein the compensation module comprises a digital counter configured to receive, as input, the one or more control signals, wherein the one or more control signals represent an integer N, and wherein the digital counter is configured to generate a counting signal for counting up to the integer N at a frequency of the output clock signal.

9. The system of claim 8, wherein the controllable frequency of the discretized sinusoidal signal is based on the integer N.

10. The system of claim 9, wherein the controllable frequency of the discretized sinusoidal signal is equal to $f_{osc}/N$, wherein $f_{osc}$ is a frequency of the output clock signal.

11. The system of claim 8, wherein the compensation module further comprises a digital decoder configured to (i) receive, as input, the counting signal and (ii) generate the discretized sinusoidal signal based on the counting signal.

12. The system of claim 11, wherein the compensation module further comprises a digital to analog converter (DAC), and wherein determining the compensation signal comprises converting, by the DAC, the discretized sinusoidal signal generated by the digital decoder into an analog signal with an analog amplitude.

13. The system of claim 12, wherein the mixer block comprises active mixers arranged in a quadrature mixing topology for mixing the analog signal with the output clock signal.

14. The system of claim 8, wherein the compensation module further comprises a look-up table or memory block that identifies a plurality of values of a theoretical sinusoidal signal, and wherein generating the discretized sinusoidal signal comprises mapping values of the counting signal to the values of the theoretical sinusoidal signal.

15. The system of claim 1, wherein the compensation module comprises a digital divider configured to receive, as input, the one or more control signals, wherein the one or more control signals represent an integer N, and wherein generating the discretized sinusoidal signal comprises dividing, by the digital divider, a frequency of the oscillator signal by the integer N.

16. The system of claim 15, wherein the compensation module further comprises a look-up table or a memory block that identifies a plurality of values of a theoretical sinusoidal signal, and wherein generating the discretized sinusoidal signal further comprises, for each respective integer between 0 and N, mapping the respective integer to a respective value of the plurality of values of the theoretical sinusoidal signal.

17. The system of claim 1, wherein the output clock signal comprises a corrected reference clock signal coming directly from the mixer block.

18. The system of claim 1, further comprising a post-divider configured to divide the output clock signal to generate a corrected reference clock signal.

* * * * *